(12) United States Patent
Kinsman et al.

(10) Patent No.: US 8,791,536 B2
(45) Date of Patent: Jul. 29, 2014

(54) STACKED SENSOR PACKAGING STRUCTURE AND METHOD

(75) Inventors: Larry Kinsman, Boise, ID (US); Yu Te Hsieh, Taoyuan (TW)

(73) Assignee: Aptina Imaging Corporation, George Town (KY)

( * ) Notice: Subject to any disclaimer, the term of this patent is extended or adjusted under 35 U.S.C. 154(b) by 304 days.

(21) Appl. No.: 13/352,844

(22) Filed: Jan. 18, 2012

(65) Prior Publication Data

US 2012/0273908 A1   Nov. 1, 2012

Related U.S. Application Data

(60) Provisional application No. 61/480,061, filed on Apr. 28, 2011.

(51) Int. Cl.
*H01L 31/0232* (2014.01)
(52) U.S. Cl.
USPC .......................................................... 257/432
(58) Field of Classification Search
None
See application file for complete search history.

(56) References Cited

U.S. PATENT DOCUMENTS

| | | | |
|---|---|---|---|
| 4,706,553 A | 11/1987 | Sharp et al. |
| 6,933,617 B2 | 8/2005 | Pierce |
| 7,042,077 B2 | 5/2006 | Walk et al. |
| 7,122,458 B2 | 10/2006 | Cheng et al. |
| 7,592,202 B2 | 9/2009 | Toyama et al. |
| 7,646,087 B2 | 1/2010 | Tu et al. |
| 7,663,231 B2 | 2/2010 | Chang et al. |
| 7,701,044 B2 | 4/2010 | Kang |
| 2008/0308928 A1 | 12/2008 | Chang et al. |
| 2009/0315180 A1 | 12/2009 | Lee |
| 2012/0194719 A1 | 8/2012 | Churchwell et al. |

OTHER PUBLICATIONS

Borthakur et al., U.S. Appl. No. 13/972,249, filed Aug. 21, 2013.

*Primary Examiner* — Yasser A Abdelaziez

(57) ABSTRACT

Disclosed herein is a stacked chip package including an image sensor including a recess formed on a surface thereof, and a digital signal processor chip that is positioned within the recess. Also disclosed herein is a method of fabricating a stacked chip package including the steps of forming a recess on a surface of an image sensor and positioning a digital signal processor in the recess of the image sensor.

19 Claims, 11 Drawing Sheets

STACKED SENSOR PACKAGING STRUCTURE AND METHOD

CROSS REFERENCE TO RELATED APPLICATIONS

This application claims priority to U.S. Provisional Patent Application No. 61/480,061, filed Apr. 28, 2011, which is incorporated by reference herein in its entirety and for all purposes.

FIELD OF THE INVENTION

The present invention relates to a chip package for an image sensor and a manufacturing method thereof.

BACKGROUND OF THE INVENTION

As described in U.S. Pat. No. 7,701,044, which is incorporated by reference, an image sensor is a device that changes light indicating an image of an object into an electric signal for each pixel. An image sensor is used for small electronic products capable of photographing still images and motion pictures, for example, digital cameras, mobile phones, PDAs (personal digital assistants), rear view monitoring cameras included in bumpers, and interphones. The image sensor includes a charge coupled device (CCD) and/or a complementary MOSFET oxidized semiconductor (CMOS). The image sensor is a type of semiconductor chip.

A semiconductor chip is packaged for protection from external shocks, the environment and the exchange of electric signals with the outside. An image sensor chip is connected to a digital signal processor (DSP) to process an electric signal output from the image sensor chip and to a memory to store image information. Also, the image sensor chip is electrically interconnected to a flexible printed circuit board (FPCB) and a hard printed circuit board (HPCB) to exchange electric signals with an electronic device outside a camera module.

FIGS. 1 and 2 are sectional views showing conventional chip packages for an image sensor. Referring to FIG. 1, an image sensor chip 1 is wire-bonded to the upper surface of an HPCB 6 via a metal wire 3. A DSP 7 is electrically connected to the HPCB 6 by being flipchip bonded to the lower surface of the HPCB 6. An infrared (IR) cut filter 9 is arranged above an image sensor 2. Referring to FIG. 2, the image sensor chip 1 is arranged at the lowermost position of a housing 4. A peripheral part of the upper surface of the image sensor chip 1 is electrically connected to the FPCB 8 via flip chip bonding 1a. The DSP 7 is located at a portion of the FPCB 8 positioned outside the housing 4.

While chip packages for an image sensor are known, there exists a continuous need to reduce the size of those chip packages in the interest of minimizing the electronic products in which those chip packages are housed.

DETAILED DESCRIPTION OF THE INVENTION

Figure 1:
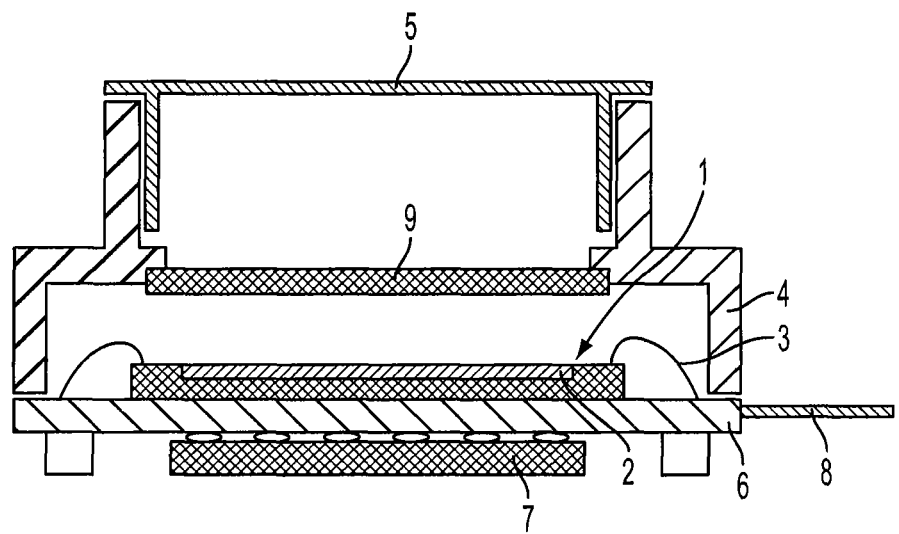
FIG. 1 is a cross-sectional view of a conventional chip package for an image sensor.
Figure 2:
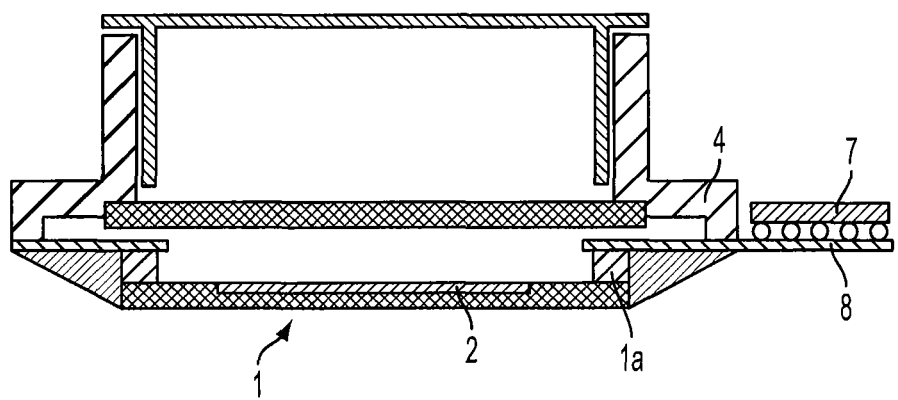
FIG. 2 is a cross-sectional view of another conventional chip package for an image sensor.
Figure 3A:
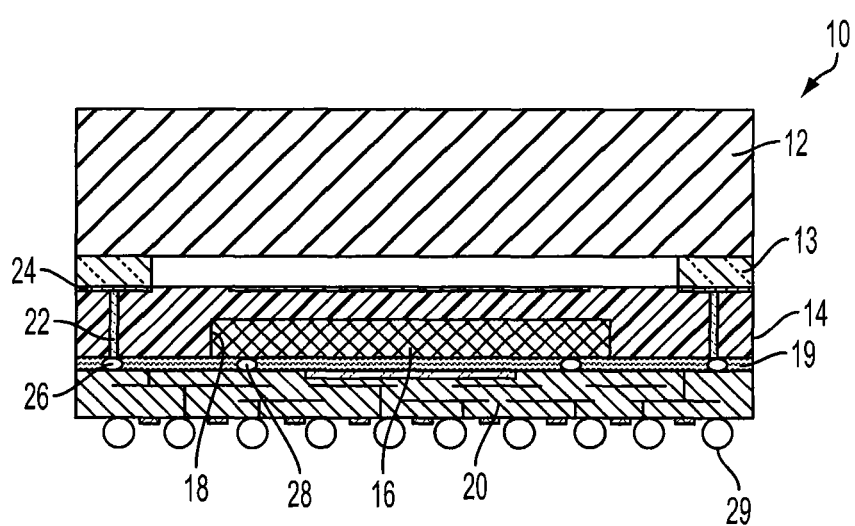
FIGS. 3A and 3B are cross-sectional schematic views of two different variations of a stacked chip package for an image sensor, according to exemplary embodiments of the invention.
Figure 3B:
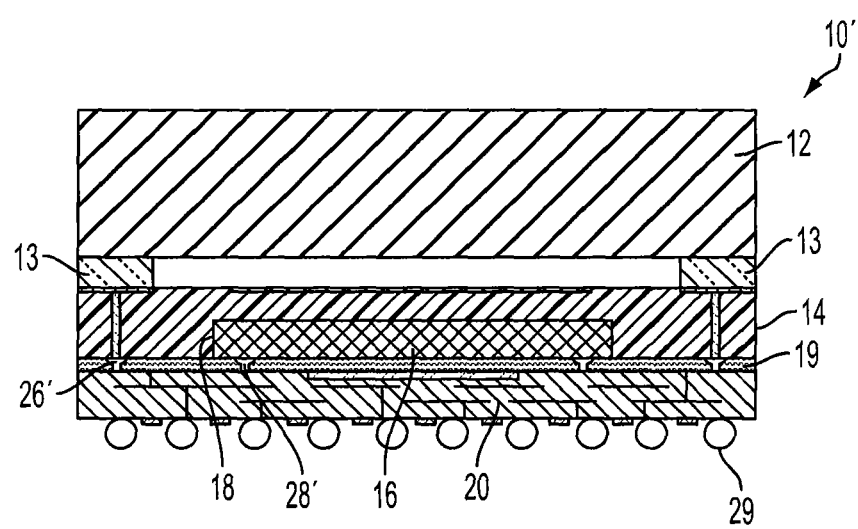

FIGS. 3A and 3B depict cross-sectional views of two different variations of a stacked chip package 10 and 10', respectively, in which a DSP is embedded in a cavity formed on a lower surface of an image sensor, according to exemplary embodiments of the invention. The primary advantages of the stacked chip package arrangements shown in FIGS. 3A and 3B are the decreased length of the signal transfer route between the DSP and the image sensor and the reduction in overall size as compared with conventional chip packages for an image sensor.

Referring to FIGS. 3A and 3B, the stacked chip packages 10 and 10', respectively, each generally comprises a lens 12 (or cover glass), a image sensor 14 mounted to the lens 12 by a resin 13, a DSP 16 that is embedded within a recess 18 that is defined on the bottom side of the image sensor 14, an underfill 19 coated on the bottom-side surfaces of the DSP 16 and the image sensor 14, and an interposer/substrate 20 applied to the underfill 19.

In the assembled form of the stacked chip packages 10 and 10', a slight gap exists between the walls of the DSP 16 and the walls of the recess 18 of the image sensor 14. The gap is useful for thermally isolating the DSP 16 from the image sensor 14. Additionally, in the assembled form, the lower surfaces of the DSP 16 and the image sensor 14 are substantially coplanar (i.e., reside on the same plane).

The components of the stacked chip package 10 are mechanically and electrically connected together by flip-chip bonding. More particularly, in both FIGS. 3A and 3B, the image sensor 14 includes a plurality of vias 22 (two shown) that are defined through its thickness each of which create an electronic interconnection between a respective aluminum pad 24 that is positioned on the top side of the image sensor 14 and a respective bump 26 (or bump 26' in FIG. 3B) on the bottom side of the image sensor 14.

The aluminum pads (not explicitly shown) of the DSP 16 are positioned face down toward the interposer 20. The bumps 28 and 28' of FIGS. 3A and 3B, respectively, that are positioned on the aluminum pads of the DSP 16 are positioned in contact with conductive regions on the top side of the interposer 20. The underfill 19 fills in the gap between the sensor 14 and the interposer 20 as well as the gap between the DSP 16 and the interposer 20. A series of solder bumps 29 that are positioned on the bottom surface of the interposer 20 are electrically connected with the conductive regions on the top surface of the interposer 20. The solder bumps 29 are provided for connecting to a substrate, circuit board, or other device of an electronic component.

One primary difference between the chip packages shown in FIGS. 3A and 3B is that the package 10 in FIG. 3A includes solder bumps 26 and 28 to accomplish electrical interconnection, whereas the package 10' in FIG. 3B includes gold stud bumps 26' and 28' to accomplish electrical interconnection.

Bonding between the image sensor 14, the DSP 16 and the interposer 20 may be accomplished by a eutectic bonding process, a metal melting process, an atomic diffusion process, a heating process, an ultrasonic heating process and/or a thermosonic heating process, for example.

In operation, the image sensor 14 captures an image through the lens 12 and converts the image to an analog signal. The analog signal is transmitted to the DSP 16 via the bumps 26, the interposer 20, and the bumps 28. The DSP 16 processes and digitizes the analog signal, and transmits the digitized signal via the bumps 28 to the interposer 20, and, via the bumps 29 of the interposer 20, to a circuit an electronic device (not shown) that is connected to the bumps 29.

Figure 4:
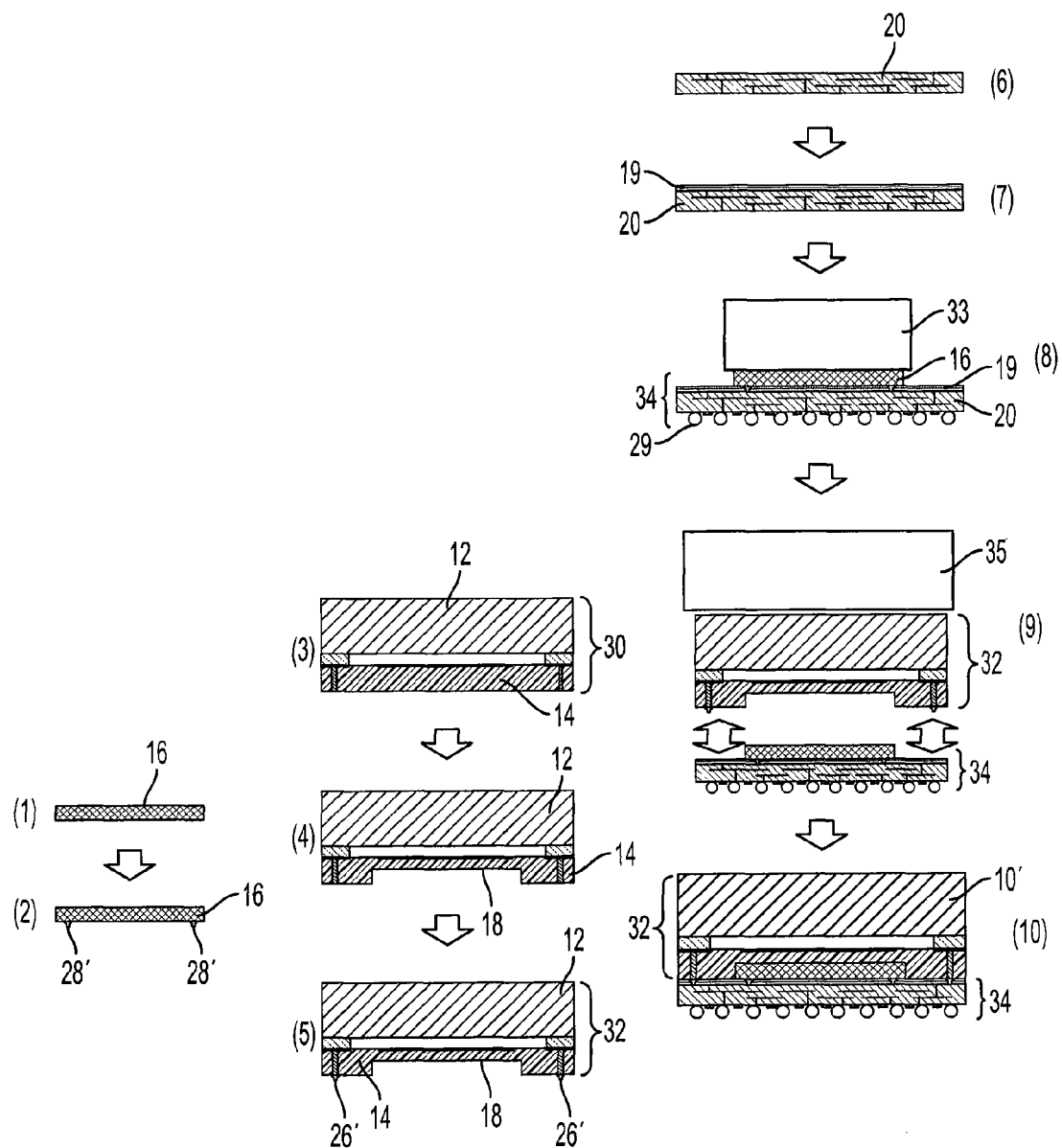
FIG. 4 is a schematic diagram depicting the process of assembling the stacked chip package of FIG. 3B.

FIG. 4 is a schematic diagram depicting an exemplary process of assembling the stacked chip package 10' of FIG. 3B. The process generally includes ten steps, which are labeled 1 through 10. The steps are not necessarily limited to the particular sequence that is described below, and may vary from that shown and described. At step 1, the DSP 16 is provided. At step 2, gold stud bumps 28' are added to the bottom side (i.e., the functional side pad) of the DSP 16. At step 3, a subassembly 30 is provided. The subassembly 30 includes the image sensor 14, the lens or cover glass 12 and other components that are mounted together. At step 4, the recess 18 is formed on the bottom side surface of the sensor 14. The recess 18 may be formed by an etching process or other chemical or physical method. At step 5, gold stud bumps 26' are added to the bottom side of the image sensor 14, thereby forming subassembly 32.

At step 6, the interposer 20 is provided. At step 7, an underfill layer is applied to the top surface of the interposer 20. At step 8, the DSP 16 is bonded to the underfill 19 by a thermosonic bonding horn 33 to form subassembly 34. At step 9, subassembly 32 is bonded to subassembly 34 by a thermosonic bonding horn 35 to form stacked chip package 10'. Thermosonic bonding is widely used to permanently interconnect metallized silicon integrated circuits and other components into computers as well as into a myriad of other electronic equipment. As noted previously, bonding may also be accomplished by a eutectic bonding process, a metal melting process, an atomic diffusion process, a heating process, or an ultrasonic heating process, for example. At step 10, the underfill 19 of the stacked chip package 10' undergoes curing thereby completing the fabrication steps.

Figure 5:
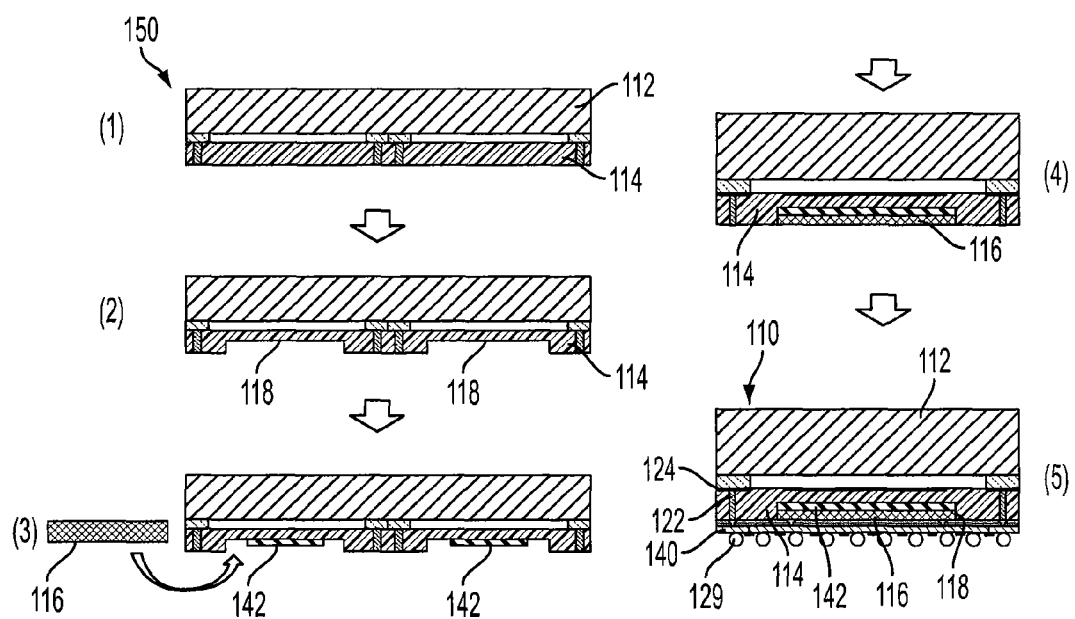
FIG. 5 depicts a cross-sectional schematic view of a stacked chip package for an image sensor (see step 5) according to another exemplary embodiment of the invention, and a schematic diagram depicting the process of assembling the stacked chip package.

FIG. 5 depicts a cross-sectional schematic view of a stacked chip package 110 (see step 5) according to another exemplary embodiment of the invention. FIG. 5 also depicts a schematic diagram depicting the process of assembling the stacked chip package 110. The stacked chip package 110 is similar to the stacked chip package 10 of FIG. 3A, with the exception that underfill 19 is replaced by a redistribution layer (RDL) 140 and a resin 142. The previous description of chip pages 10 also applies to chip package 110.

More particularly, the image sensor 114 of FIG. 5 includes a plurality of vias 122 (two shown) that are defined through its thickness. Each of the vias 122 create an electronic interconnection between a respective aluminum pad 124 that is positioned on the top side of the image sensor 114 and solder or gold bumps on the top side of the RDL 140. Although not explicitly shown, the bumps are provided on a fan out pad on the top surface of the RDL 140. There may also be thermal pads on the RDL 140 for the purpose of heat dissipation. The insulation layer of the RDL 140 may be composed of $SiO_2$, Ajinomoto Build-up Film (ABF), or other organic materials, for example.

The top side of the DSP 116 is adhered to the recess 118 of the image sensor 114 by a layer of resin 142. The resin 142 could be a liquid type adhesive or a B-stage adhesive film, such as die attach adhesive film, for example. The resin 142 is thermally insulative such that it thermally isolates the DSP 116 from the image sensor 114. Aluminum pads (not explicitly shown) on the bottom side of the DSP 116 are positioned face-down in contact with conductive regions on the top surface of the RDL 140 by vias that extend through the thickness of the RDL 140. The RDL 140 electrically interconnects the DSP 116 to the image sensor 114.

A series of solder bumps 129 that are positioned on the bottom surface of the RDL 140 are electrically connected with the conductive regions on the top surface of the RDL 140. The solder bumps 129 of the RDL 140 are provided for connecting to a substrate, circuit board, or other device of an electronic component.

Referring now to an exemplary method of assembling the stacked chip package 110, at step 1 in FIG. 5, a subassembly 150 including the image sensor 114, the lens 112 and other components is provided. The subassembly 150 is large enough to form a plurality of stacked chip packages 110 (two shown). At step 2, a plurality of recesses 118 are formed on the bottom side surface of the sensor 114. The recesses 118 may be formed by an etching process or other chemical or physical method. At step 3, resin 142 is distributed in both recesses 118, and two DSP's 116 (only one shown) are applied to the resin material 142. At step 4, the subassembly formed in step 3 is singulated, or separated, into individual chip packages. At step 5, the top side of the RDL 140 is mounted to the bottom sides of the DSP 116 and the sensor 114. The bumps 129 are then added to the bottom side of the RDL 140, thereby completing the fabrication steps. It should be understood that the foregoing steps are not necessarily limited to a particular sequence.

Figure 6A:
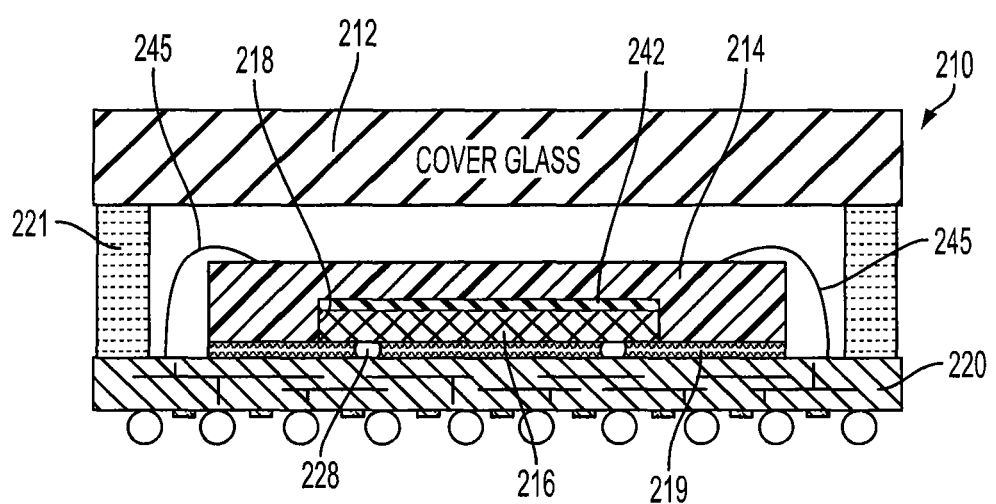
FIGS. 6A and 6B are cross-sectional schematic views of two different variations of a stacked chip package for an image sensor, according to yet other exemplary embodiments of the invention.
Figure 6B:
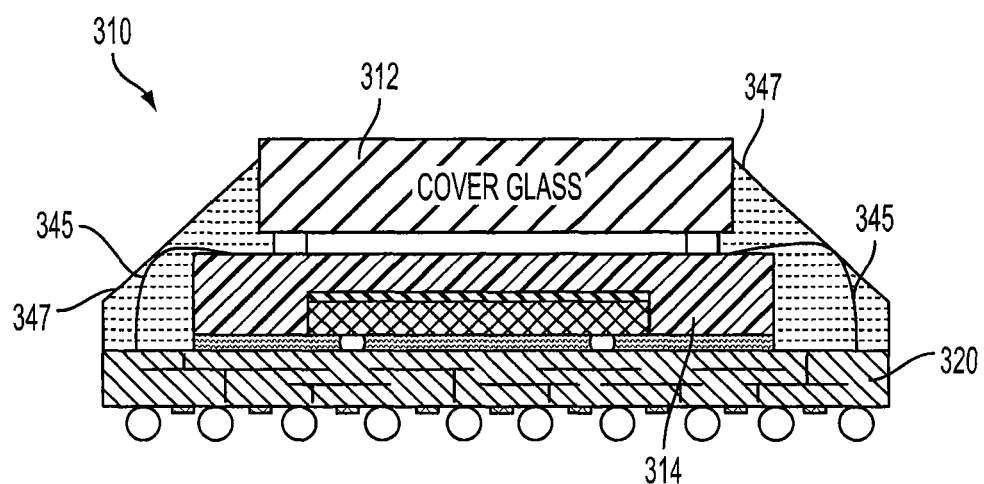

FIGS. 6A and 6B are cross-sectional schematic views of two different variations of a stacked chip package for an image sensor, according to yet other exemplary embodiments of the invention. The stacked chip package 210 shown in FIG. 6A is similar to the stacked chip package 10, thus, the details of stacked chip package 10 also apply to stacked chip package 210. Only significant differences between those chip packages will be described hereinafter.

The components of the stacked chip package 210 are mechanically and electrically connected together by flip-chip and wire bonding. More particularly, in lieu of vias, the image sensor 214 is electrically interconnected with the substrate 220 by wire leads 245. The wire leads 245 may be composed of gold, aluminum or copper, for example.

The top side of the DSP 216 is adhered to the recess 218 of the image sensor 214 by a layer of resin 242, similar to the resin 142 of FIG. 5. The aluminum pads (not explicitly shown) of the DSP 216 are positioned face down toward the substrate 220. The bumps 228, which may be composed of solder or gold, that are positioned on the aluminum pads of the DSP 216 are positioned in contact with conductive regions on the top side of the substrate 220. Although not shown, vias and traces within the substrate 220 electrically interconnect the leads 245 of the sensor 214 with the bumps 228 of the DSP 216. A die-attach adhesive 219 mounts the sensor 214 and the DSP 216 to the substrate 220.

The cover glass 212 is mounted to the substrate 220 by a dam 221. The function of the dam 221 is to support the lens or cover glass 12 and form an air cavity in the package. The dam material may be BT, FR4, FR5, thermoplastic, epoxy molding compound, ceramic. The stacked chip package 310 shown in FIG. 6B is similar to the stacked chip package 210 of FIG. 6A, thus, the details of stacked chip packages 10 and 210 also apply to stacked chip package 310. Only the significant differences between those chip packages will be described hereinafter. In lieu of the dam of FIG. 6A, a liquid compound 347 mounts the cover glass 312, the substrate 320 and the image sensor 314 together. The leads 345 are encapsulated within the liquid compound 347.

Figure 7A:
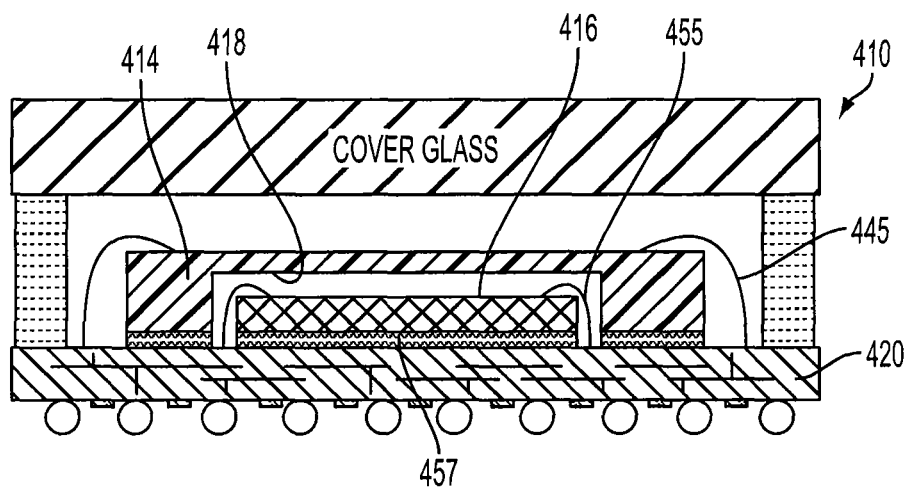
FIGS. 7A and 7B are cross-sectional schematic views of two different variations of a stacked chip package for an image sensor, according to still other exemplary embodiments of the invention.
Figure 7B:
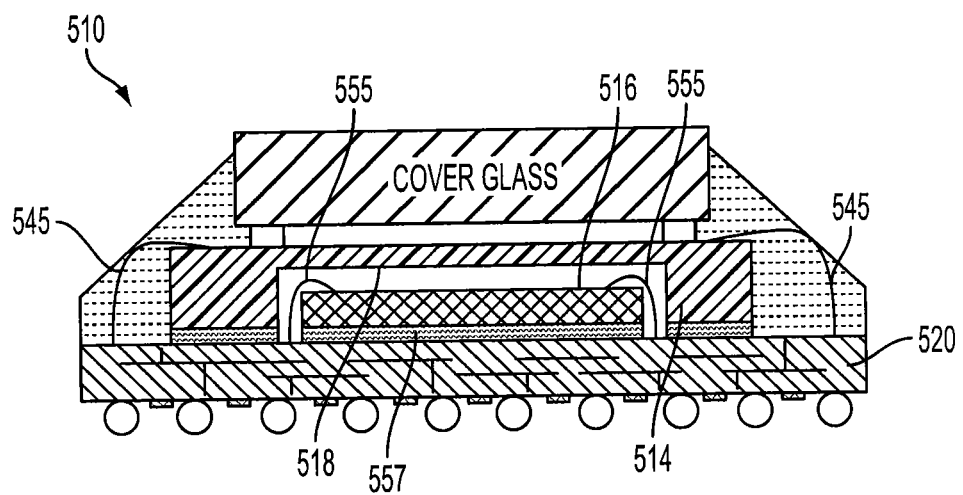

FIGS. 7A and 7B are cross-sectional schematic views of two different variations of a stacked chip package for an image sensor, according to still other exemplary embodiments of the invention. The stacked chip package 410 shown in FIG. 7A is similar to the stacked chip package 210 of FIG. 6A, thus, the details of stacked chip packages 10 and 210 also apply to stacked chip package 410. Only significant differences between those chip packages will be described hereinafter.

In the stacked chip package 410 of FIG. 7A, the primary components of the stacked chip package 10 are mechanically and electrically connected together by wire bonding. In lieu of vias, the DSP 416 is electrically interconnected with the substrate 420 by wire leads 455, and the image sensor 414 is electrically connected to the substrate 420 by wire leads 445. The leads may be wires composed of gold, aluminum or copper, for example. Although not shown, vias and traces within the substrate 420 electrically interconnect the leads 445 of the sensor 414 with the leads 455 of the DSP 416 such that the DSP 416 and the sensor 414 are in electrical communication. The DSP 416 is bonded to the substrate 420 by a die attach adhesive 457. Unlike the DSP of FIG. 6A, the DSP 416 is not bonded to the recess 418 formed in the image sensor 414.

The stacked chip package 510 shown in FIG. 7B is similar to the stacked chip package 310 of FIG. 6B, thus, the details of the stacked chip package 310 also apply to the stacked chip package 510. Only significant differences between those chip packages will be described hereinafter. In the stacked chip package 510 of FIG. 7B, the DSP 516 is bonded to the substrate 520 by a die attach adhesive 557. In lieu of vias, the DSP 516 is electrically interconnected with the substrate 520 by leads 555, and the image sensor 514 is electrically connected to the substrate 520 by leads 545. Although not shown, vias and traces within the substrate 520 electrically interconnect the leads 545 of the sensor 514 with the leads 555 of the DSP 516 such that the DSP 516 and the sensor 514 are in electrical communication.

Figure 8:
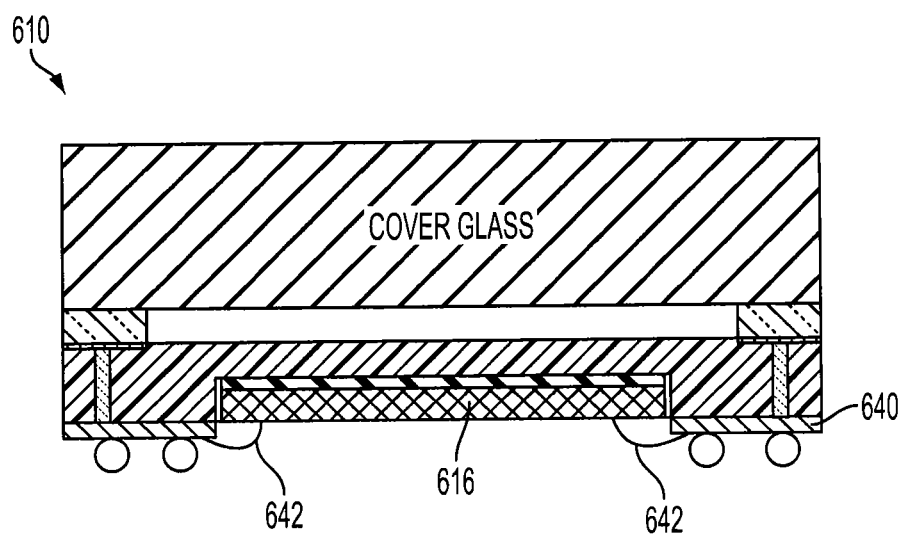
FIG. 8 depicts a cross-sectional schematic view of a stacked chip package for an image sensor according to another exemplary embodiment of the invention.

FIG. 8 depicts a cross-sectional schematic view of a stacked chip package for an image sensor according to another exemplary embodiment of the invention. The stacked chip package 610 shown in FIG. 8 is similar to the stacked chip package 110 of FIG. 5, thus, the details of stacked chip package 110 also apply to stacked chip package 610. Only significant differences between those chip packages will be described hereinafter. In lieu of mounting the DSP 616 directly to the RDL 640, such as is shown in FIG. 5, the DSP 616 is indirectly connected to the bottom side of the RDL 640 by leads 642.

The materials of the stacked chip packages disclosed herein may vary as described hereinafter. The lens, which may also be referred to in the art as cover glass, is optionally composed of glass. The image sensor may be a charge coupled device (CCD) and/or a complementary MOSFET oxidized semiconductor (CMOS). The image sensor may be at least partially composed of Silicon material. The DSP may be any DSP known to those skilled in the art that is configured to convert an analog signal output from an image sensor chip to a digital signal.

The interposer may be composed of silicon with a redistribution layer (RDL), BT, FR4, FR5, ceramic, an organic substrate, or any other material that is known to those skilled in the art. The terms 'interposer' and 'substrate' may be used interchangeably. The interposer may also be considered as a substrate. A substrate is a part that provides the chip package with mechanical base support and forms an electrical interface that allows access to the devices housed within the chip package. An interposer is an intermediate layer that is often used for interconnection routing or as a ground/power plane.

What is claimed:

1. A stacked chip package comprising:
    an image sensor including a recess formed on a surface thereof;
    a digital signal processor chip that is positioned within the recess, wherein a mounting surface of the image sensor and a mounting surface of the digital signal processor chip are both mounted to a substrate that includes a plurality of vias and a plurality of traces; and
    adhesive securing the digital signal processor chip to the substrate.

2. The stacked chip package of claim 1, wherein the recess is formed on the mounting surface of the image sensor.

3. The stacked chip package of claim 1, wherein the mounting surfaces of the image sensor and the digital signal processor chip are substantially coplanar.

4. The stacked chip package of claim 1, wherein the image sensor is electrically connected to the substrate by vias or wire leads.

5. The stacked chip package of claim 1, wherein the digital signal processor chip is electrically connected to the substrate by vias or wire leads.

6. The stacked chip package of claim 1, wherein traces and vias of the substrate electrically connect the image sensor to the digital signal processor chip.

7. The stacked chip package of claim 1, further comprising a lens or cover glass positioned adjacent the image sensor.

8. An image sensor including a recess formed on a surface thereof that is sized to accommodate a digital signal processor of a chip package, wherein the recess is larger than the digital signal processor such that there is a thermally insulating gap between the digital signal processor and the image sensor.

9. The image sensor of claim 8, wherein the recess is formed on an bottom-side surface of the image sensor, and a top-side surface of the image sensor is configured to be exposed to light.

10. The image sensor of claim 9 further comprising a conductive region on the top-side surface of the image sensor that is electrically connected to a via that extends between the top-side surface and the bottom-side surface of the image sensor.

11. The image sensor of claim 10 further comprising a bump that is positioned on the bottom-side surface of the image sensor and connected to the via.

12. The image sensor of claim 9, wherein the recess is etched into the surface of the image sensor.

13. A method of fabricating a stacked chip package comprising:
    forming a recess on a surface of an image sensor that is sized to accommodate a digital signal processor; and
    mounting the digital signal processor and the image sensor onto a substrate, wherein the mounting step comprises orienting mounting surfaces of the digital signal processor and the image sensor such that the mounting surfaces are substantially coplanar and comprises securing the digital signal processor to the substrate with adhesive.

14. The method of claim 13, wherein the forming step comprises etching the recess in the surface of the image sensor.

15. The method of claim 13, further comprising the step of positioning a digital signal processor in the recess of the image sensor.

16. The method of claim 13, wherein the mounting step comprises electrically connecting the digital signal processor and the image sensor to the substrate by either wire bonding or flip chip bonding.

17. The method of claim 13, further comprising the step of mounting a lens or cover glass adjacent the image sensor.

18. The stacked chip package of claim 1, wherein the mounting surfaces of the digital signal processor chip and the image sensor comprise lower surfaces of the digital signal processor chip and the image sensor, respectively, the stacked chip package further comprising:
   wire leads extending between an upper surface of the digital signal processor chip and the substrate.

19. The stacked chip package of claim 18 further comprising:
   additional wire leads extending between an upper surface of the image sensor and the substrate.

* * * * *